(12) United States Patent
Wölfel

(10) Patent No.: US 9,474,149 B2
(45) Date of Patent: Oct. 18, 2016

(54) ANGLE-ADJUSTABLE AND/OR ANGLED PRINTED CIRCUIT BOARD STRUCTURE HAVING AT LEAST TWO PRINTED CIRCUIT BOARD SECTIONS AND METHOD FOR PRODUCING THE SAME

(71) Applicant: JUMATECH GMBH, Eckenthal (DE)

(72) Inventor: Markus Wölfel, Lauf (DE)

(73) Assignee: JUMATECH GMBH, Eckental (DE)

( * ) Notice: Subject to any disclaimer, the term of this patent is extended or adjusted under 35 U.S.C. 154(b) by 0 days.

(21) Appl. No.: 14/443,231

(22) PCT Filed: Nov. 15, 2013

(86) PCT No.: PCT/EP2013/073939
§ 371 (c)(1),
(2) Date: May 15, 2015

(87) PCT Pub. No.: WO2014/076233
PCT Pub. Date: May 22, 2014

(65) Prior Publication Data
US 2015/0327355 A1    Nov. 12, 2015

(30) Foreign Application Priority Data

Nov. 16, 2012   (DE) .......................... 10 2012 221 002

(51) Int. Cl.
*H05K 1/02*       (2006.01)
*H05K 3/00*       (2006.01)
(Continued)

(52) U.S. Cl.
CPC ............ *H05K 1/028* (2013.01); *H05K 1/0278* (2013.01); *H05K 1/111* (2013.01); *H05K 3/0014* (2013.01);
(Continued)

(58) Field of Classification Search
CPC combination set(s) only.
See application file for complete search history.

(56) References Cited

U.S. PATENT DOCUMENTS 5,449,480 A    9/1995  Kuriya et al.
6,016,253 A    1/2000  Seitz et al.
(Continued)

FOREIGN PATENT DOCUMENTS

DE    19522838    1/1997
DE    19817354    10/1999
(Continued)

OTHER PUBLICATIONS

International Search Report dated Apr. 2, 2014, which issued during prosecution of International Application No. PCT/EP2013/073939, which corresponds to the present application.
(Continued)

*Primary Examiner* — Jeremy C Norris
(74) *Attorney, Agent, or Firm* — Troutman Sanders LLP

(57) ABSTRACT

The invention relates to an angle-adjustable and/or printed circuit board structure having at least two printed circuit board sections arrangeable or arranged angularly with respect to one another, wherein the printed circuit board structure contains at least one conduction element which is embedded at least predominantly in the printed circuit board structure and which extends between two contact pads and is electrically conductively connected to said contact pads, wherein the two contact pads are situated on different printed circuit board sections, wherein the printed circuit board sections are angle-adjustable and/or angled relative to one another with maintenance of the connections between the contact pads and the at least one conduction element and with bending of the at least one conduction element via a bending edge between the printed circuit board sections. In order to improve the electrical and mechanical connection between the printed circuit board sections, the invention provides for the conduction element to have a larger extent along the bending edge than perpendicularly thereto, as viewed in cross section. A corresponding method for producing this printed circuit board structure is like wise claimed.

9 Claims, 1 Drawing Sheet

(51) Int. Cl.
*H05K 1/11* (2006.01)
*H05K 3/20* (2006.01)

(52) U.S. Cl.
CPC .......... *H05K 3/0017* (2013.01); *H05K 1/0265* (2013.01); *H05K 3/202* (2013.01); *H05K 2201/0275* (2013.01); *H05K 2201/0355* (2013.01); *H05K 2201/0376* (2013.01); *H05K 2201/057* (2013.01); *H05K 2201/09027* (2013.01); *H05K 2201/0969* (2013.01); *H05K 2201/1028* (2013.01); *Y10T 29/49156* (2015.01)

(56) References Cited

U.S. PATENT DOCUMENTS

| | | | |
|---|---|---|---|
| 6,075,708 | A | 6/2000 | Nakamura |
| 6,531,662 | B1 | 3/2003 | Nakamura |
| 2005/0018409 | A1 | 1/2005 | Hirakata |

FOREIGN PATENT DOCUMENTS

| | | |
|---|---|---|
| DE | 19912519 | 11/2000 |
| DE | 10108168 | 10/2001 |
| DE | 102006004321 | 8/2007 |
| EP | 0903969 | 3/1999 |
| JP | H06021593 A | 1/1994 |
| JP | H06326428 A | 11/1994 |
| JP | H10321971 A | 12/1998 |
| JP | H11087874 A | 3/1999 |
| JP | 2001210950 A | 8/2001 |
| JP | 2004356568 A | 12/2004 |
| JP | 2005057259 A | 3/2005 |
| JP | 2009105198 A | 5/2009 |
| WO | 02067642 | 8/2002 |
| WO | 2006077164 | 7/2006 |
| WO | 2007087981 | 8/2007 |

OTHER PUBLICATIONS

Japanese Office Action mailed Jun. 21, 2016 issued in corresponding Japanese Patent Application No. 2015-542273.

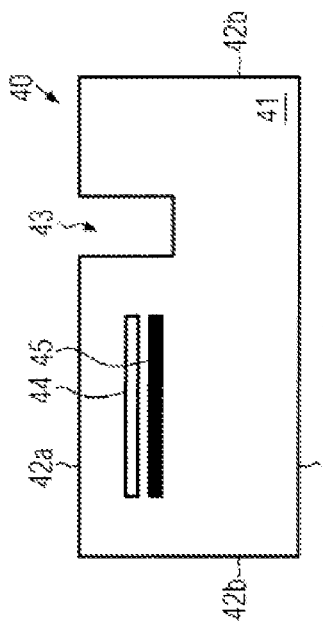
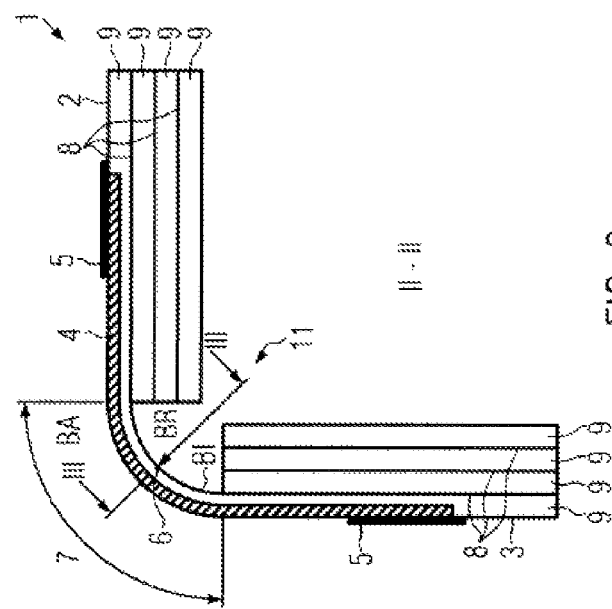
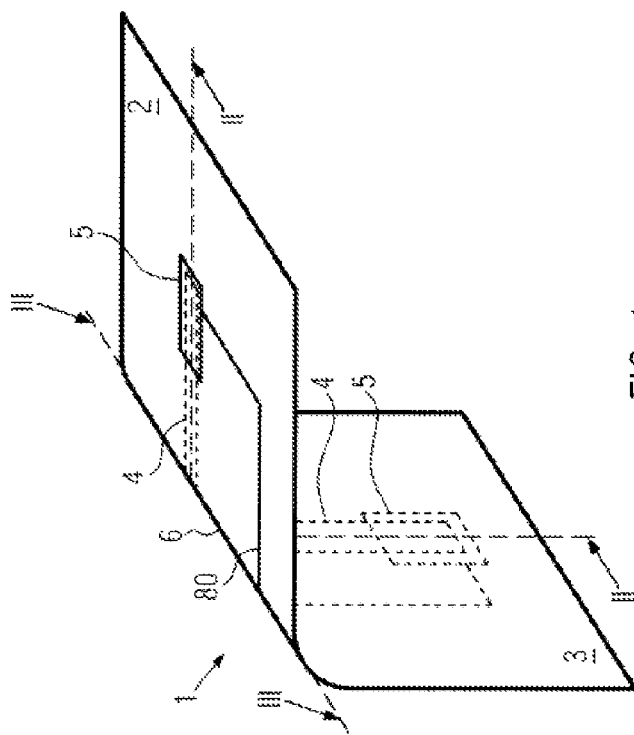
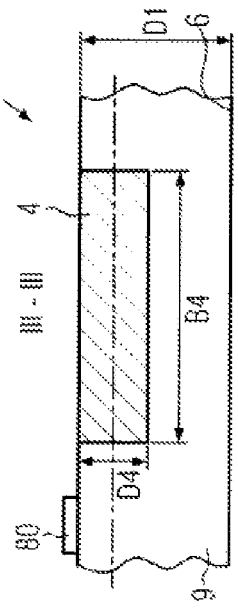
FIG. 1
FIG. 2
FIG. 3
FIG. 4

ANGLE-ADJUSTABLE AND/OR ANGLED PRINTED CIRCUIT BOARD STRUCTURE HAVING AT LEAST TWO PRINTED CIRCUIT BOARD SECTIONS AND METHOD FOR PRODUCING THE SAME

CROSS REFERENCE TO RELATED APPLICATIONS

This application claims priority to International Application No. PCT/EP2013/073939 filed Nov. 15, 2013. The International Application published as WO 2014/076233 on May 22, 2014. The International Application claims priority German Patent Application No. 10 2012 221 002.4 filed Nov. 16, 2012. All of the above applications are incorporated herein by reference.

FIELD OF INVENTION

The invention relates to an angle-adjustable and/or angled printed circuit board structure having at least two circuit board sections arrangeable or arranged angularly with respect to each other.

BACKGROUND

The angle-adjustable printed circuit board structure contains at least one conduction element which extends between two contact pads and is electrically conductively connected to said contact pads, wherein the two contact pads are situated on different printed circuit board sections, wherein the printed circuit board sections are angle-adjustable and/or angled relative to one another with maintenance of the connections between the contact pads and the at least one conduction element and with bending of the at least one conduction element via a bending edge between the printed circuit board sections.

Such a printed circuit board structure is known from WO 2006/077164 A2.

It is an object of the present invention to further develop an angle-adjustable printed circuit board structure of the type mentioned in the beginning in such a way that an essential improvement of the electrical and mechanical connection between the printed circuit board sections may be achieved.

SUMMARY

According to the invention, this object is achieved by the angle-adjustable and/or angled printed circuit board structure that includes at least two circuit board sections arrangeable or arranged angularly with respect to each other, wherein the printed circuit board structure contains at least one conduction element which extends between two contact pads and is electrically conductively connected to said contact pads, wherein the two contact pads are situated on different printed circuit board sections, wherein the printed circuit board sections are angle-adjustable and/or angled relative to one another with maintenance of the connections between the contact pads and the at least one conduction element and with bending of the at least one conduction element via a bending edge between the printed circuit board sections, wherein the conduction element has a larger extent along the bending edge than perpendicularly thereto, as viewed in cross-section.

The cross-section along the bending edge is preferably defined by the smallest bend radius, the bend radius typically being the smallest in the crest of the bend. In contrast to the conventional printed circuit board structure, according to the invention at least one flat conduction element extends over the bending edge which is, different from the conventionally employed round wires, better bendable and may establish, both in an electrical and in a mechanical respect, an essentially better connection between the printed circuit board sections. Furthermore, manufacture expenses and efforts are considerably reduced compared to the well-known solution because, e.g. instead of a plurality of round wires, only one single conduction element with a corresponding conductor cross-section must be laid to transfer comparable quantities of heat and currents between the printed circuit board sections. Moreover, the number of contacts to be established between the conduction element and the contact pads may be considerably reduced compared to the conventional solutions with round wires. In addition, the mechanical strength of the inventive printed circuit board structure is considerably increased due to the flat conduction element in contrast to the plurality of round wires because an essentially improved stiffness against torsion may be achieved by the extension of the conduction element along the bending edge. Moreover, the mechanical stability of the printed circuit board structure may be improved if the shaped part accomplishes a tear protection at the borders. Preferably, at least the majority, preferably all of the conduction element is embedded in the printed circuit board structure. Moreover, the bending edge preferably extends at or parallel to a surface of the printed circuit board structure.

The printed circuit board structure according to the invention is preferably employed in the field of power electronics. The term power electronics generally circumscribes the electrical engineering subarea involving the transformation of electric energy with electric or electronic components. The term circuit or control electronics is in contrast generally essentially defined as the use of electric power only for signal and data processing. Where the printed circuit board structure is employed in the field of power electronics, the conductor cross-sections required for handling the occurring currents and heat quantities may be perfectly realized with the flat conduction element. Thereby, thermal problems in the form of overheating may be prevented. In conventional printed circuit boards, these thermal problems often resulted in a restriction of the printed circuit board structure to certain power values.

It may be advantageous for the conduction element to be a conducting wire that meets at least one of the following requirements:

The conducting wire consists of a conductive material, preferably of metal, preferably of copper.

The conducting wire is made by extrusion.

The conducting wire has a polygonal, preferably rectangular or essentially rectangular cross-section, wherein the side of the cross-section having the larger extent extends along the bending edge or in parallel thereto.

The conducting wire has, preferably in a cross-section along the bending edge, a thickness within a range of 10 to 500 µm, preferably within a range of 50 to 400 µm, preferably within a range of 100 to 200 µm.

A width of the conducting wire is, preferably in a cross-section along the bending edge, at least 1.5 to 100 times, preferably 2 to 10 times larger than the thickness of the conducting wire.

At least the majority of the conducting wire is embedded in the printed circuit board structure.

The conducting wire is roughened.

The conducting wire is chemically roughened, preferably by chemical etching, where chemical etching is preferably accomplished by immersing the conducting wire into a liquid that etches the material of the conducting wire or by spraying the conducting wire with such a liquid.

The conducting wire is mechanically roughened, preferably by machining, preferably by knurling, by sandblasting or by spraying on pumice or quartz powder under high pressure.

Such a conducting wire may contact the contact pad over a particularly large surface and thus transfer larger quantities of heat and current between the printed circuit board sections.

However, it may also prove useful for the conduction element to be a plate-like shaped part which meets at least one of the following requirements:

The shaped part consists of an electrically conductive material, preferably of metal, preferably of copper.

At least some sections, preferably all of the shaped part is embedded in the printed circuit board structure.

The flat sides of the shaped part are oriented essentially in parallel to at least one surface of the printed circuit board structure.

At least one flat side of the shaped part flushly passes over into an adjoining surface of the printed circuit board structure.

The shaped part is separated from a plate-like workpiece, preferably by water jet cutting, eroding or separating, preferably by punching.

The shaped part has a thickness, preferably in a cross-section along the bending edge, within a range of 50 to 500 µm, preferably within a range of 75 to 400 µm, preferably within a range of 100 to 200 µm.

A width of the shaped part is, preferably in the cross-section along the bending edge, at least five times, preferably at least ten times, preferably at least twenty times, preferably at least fifty times, or preferably at least one hundred times as large as the thickness of the shaped part.

The shaped part comprises, preferably in a cross-section along the bending edge, a rectangular or essentially rectangular cross-section.

The thickness of the shaped part is constant, preferably in a cross-section along the bending edge.

The shaped part projects at least in sections from the printed circuit board structure, preferably in the area of at least one circuit board section.

The shaped part comprises at least one recess which is worked into the shaped part starting from a border side of the shaped part.

The shaped part comprises at least one breakthrough which extends transversely, preferably perpendicularly, to a flat side or a border side of the shaped part through the shaped part, wherein the breakthrough preferably comprises a circular, oval, polygonal, preferably triangular, quadrangular, pentangular, rectangular or square contour, wherein the breakthrough preferably has an essentially slot-like design and continuously or discontinuously extends along a straight or bent line, said line extending particularly preferred at least in sections in parallel to a border side of the shaped part wherein the breakthrough is particularly preferred filled with insulation and stabilization agents at least in sections.

The shaped part comprises at least one opening which extends in sections from a flat side or a border side of the shaped part into the shaped part, wherein the opening preferably comprises, at least in the area of its orifice, a circular, oval, polygonal, preferably triangular, quadrangular, pentangular, preferably rectangular or square contour, wherein the opening preferably has an essentially groove-like design and continuously or discontinuously extends along a straight or bent line, said line extending particularly preferred at least in sections in parallel to a border side of the shaped part, wherein the opening is particularly preferred filled with insulation and stabilization agents at least in sections.

The shaped part and/or a section of the shaped part is, as viewed onto a flat side of the shaped part, essentially I-shaped, L-shaped, T-shaped, H-shaped, S-shaped, O-shaped, E-shaped, F-shaped, X-shaped, Y-shaped, Z-shaped, C-shaped, U-shaped or Ω-shaped.

Several shaped parts are arranged within the printed circuit board structure in the same plane or in different planes, preferably in planes parallel with respect to each other.

At least the majority of the shaped part is embedded in the printed circuit board structure.

The shaped part is roughened.

The shaped part is chemically roughened, preferably by chemical etching, chemical etching being preferably accomplished by immersing the shaped part into a liquid that etches the material of the shaped part or by spraying such a liquid onto the conducting wire.

The shaped part is mechanically roughened, preferably by machining, preferably by knurling, by sandblasting or by spraying on pumice or quartz powder under high pressure.

Compared to a flat wire, such a shaped part may accomplish a further improved electrical and/or mechanical connection between the printed circuit board sections.

It may also prove useful for at least one contact pad to meet at least one of the following requirements:

The contact pad is arranged at a surface of the printed circuit board structure.

The contact pad contacts the conduction element and/or at least one electric component at least at one contact location each, wherein the conduction element and/or the electric component are preferably arranged at different flat sides of the contact pad, wherein preferably several contact locations are spaced apart preferably at regular distances.

Contacting between the contact pad and the conduction element and/or between the contact pad and the at least one electric component at the at least one contact location is accomplished by welding, bonding, soldering or conductive adhesion.

The contact pad consists of metal, preferably of copper.

The contact pad is worked out of a conductive surface element, in particular of a copper foil, preferably by etching.

The contact pad has a thickness within a range of 1 to 200 µm, preferably within a range of 10 to 100 µm, preferably within a range of 15 to 50 µm.

In at least one region between the contact pad and the conduction element, preferably between two contact locations and/or around at least one contact location, insulation and stabilization agents are arranged.

Several contact pads and/or several conduction elements are connected via at least one strip conductor, the strip conductor preferably being printed or etched.

The contact pad is designed for electrical connections and/or for electric components.

Such a contact pad permits a contact to the conduction element over a particularly large surface, so that the transmission capacity with respect to heat and current quantities between the contact pad and the conduction element may be even more increased.

It may also be useful for the bending edge to meet at least one of the following requirements:

The bending edge has an essentially linear design.

The bending edge extends along a straight and/or bent line at least in sections.

The bending edge extends from a border side of the printed circuit board structure to an opposite border side of the printed circuit board structure.

The bending edge extends at the inner bending side of the printed circuit board structure through the crest of the bend.

The bending edge extends at a printed circuit board structure or in parallel to a surface of the same.

The position of the bending edge is preferably clearly identifiable by the crest of the bend at the inner bending side of the printed circuit board structure.

It may prove practical for the printed circuit board structure to comprise a deformation section between the printed circuit board sections comprising the bending edge, the deformation section meeting at least one of the following requirements:

In the deformation section, the stiffness and/or the stability and/or the strength of the printed circuit board structure is reduced with respect to the adjoining printed circuit board sections, preferably along the bending edge, preferably at the inner bending side and/or at the outer bending side.

In the deformation section, the circuit board material is at least partially removed, preferably at the inner bending side and/or at the outer bending side, preferably by milling, sawing or laser beam machining.

In the deformation section, the printed circuit board structure comprises at least one groove which extends preferably at least in sections along the bending edge at the inner bending side and/or at the outer bending side, wherein the groove preferably has a constant width or tapers from the groove opening to the groove bottom, or vice-versa, wherein particularly preferred foreign matter is incorporated in the groove in order to fix an angled state of the printed circuit board structure.

In the deformation section, a bend radius of the printed circuit board structure and/or the conduction element is within a range of 0.05 to 10 mm, preferably within a range of 1 to 8 mm, preferably within a range of 3 to 7 mm at the inner bending side.

In the deformation section, the thickness of the printed circuit board structure is within a range of 100 to 1000 µm, preferably within a range of 150 to 500 µm, preferably within a range of 200 to 300 µm.

The deformation section forms a solid-state joint to be able to flexibly move the printed circuit board sections with respect to each other.

The deformation section permits a controlled angling and/or fixation of the shape of the printed circuit board structure by the particular design according to at least one of the above features, wherein the risk of damaging the conduction element during the operations of angling the printed circuit board structure and bending the conduction element is clearly reduced. By the purposeful change of mechanical parameters, the printed circuit board structure may form a solid-state joint along the bending edge which represents a simple possibility of flexibly connecting the printed circuit board sections of the printed circuit board structure to each other. In particular in small-and medium-batch production, the material removal represents a reasonable, inexpensive and, with respect to production, flexible possibility of designing the printed circuit board sections movably with respect to each other. By partially removing printed circuit board material, the stiffness of the printed circuit board structure along the bending edge is reduced and the bending edge is brought closer to the wiring plane of the interconnected printed circuit board sections to such an extent that a mechanical damage to the conducting wires in the angling region is excluded during angling and thus a reliable electrical connection of the individual printed circuit board sections of the printed circuit board structure may be ensured.

However, it may also be useful for the printed circuit board structure to comprise at least one thin surface element which is conductive at least in sections and meets at least one of the following requirements:

The surface element is a conductive foil, preferably a copper foil.

The surface element is produced by rolling.

The surface element has a thickness within a range of 10 to 100 µm, preferably within a range of 20 to 50 µm, preferably within a range of 30 to 40 µm.

At least one surface element is arranged at a surface of the printed circuit board structure at least in sections.

At least one surface element is arranged in parallel to a surface of the printed circuit board structure underneath said surface of the printed circuit board structure at least in sections.

The surface element is machined in sections to form at least one strip conductor and/or at least one contact pad.

At least one strip conductor and/or at least one contact pad is worked out of the surface element, preferably by etching.

At least one surface element or at least one strip conductor or contact pad worked out of the surface element extends from a printed circuit board section via the bending edge into another printed circuit board section.

At least one surface element is arranged at the outer bending side or at the inner bending side of the printed circuit board structure.

At least one surface element is arranged radially outside the at least one conduction element, based on the bend radius of the printed circuit board structure.

The use of said thin and conductive surface element permits a particularly inexpensive and effective manufacture of the printed circuit board structure according to the invention since in particular a conductive pattern with strip conductors and contact pads may be produced in one single etching operation.

It may also prove advantageous for the printed circuit board structure to comprise an insulation and stabilization agent which meets at least one of the following requirements:

The insulation and stabilization agent separates at least two conductive layers, preferably at least two conductive surface elements.

The insulation and stabilization agent surrounds the at least one conduction element, as viewed in cross-section, over at least a part of its circumference.

The insulation and stabilization agent covers the at least one conduction element, as viewed in cross-section, at least at one border side and/or at least at one flat side, preferably at the outer bending side and/or at the inner bending side.

The insulation and stabilization agent surrounds the at least one conduction element, as viewed in cross-section, over its entire circumference, except for one or several contact locations to at least one electrically conductive contact pad.

The insulation and stabilization agent comprises a reinforcement, preferably a glass-fiber reinforcement.

The insulation and stabilization agent imparts inherent strength and stiffness to the printed circuit board structure while the printed circuit board structures may simultaneously be electrically insulated with respect to each other to avoid wrong contacts.

The above object is also achieved according to the invention by a method for producing an angle-adjustable and/or angled printed circuit board structure having at least two printed circuit board sections, comprising the following steps:

producing a plane printed circuit board having at least one conduction element which has, as viewed in cross-section or in parallel to the printed circuit board plane, a larger extent than perpendicularly thereto, wherein the conduction element extends between two contact pads and is electrically conductively connected with said contact pads, wherein the two contact pads are located on different printed circuit board sections;

providing at least one bending edge between the printed circuit board sections, wherein said printed circuit board sections are angle-adjustable relative to one another with maintenance of the connections between the contact pads and the at least one conduction element and with bending of the at least one conduction element via the bending edge.

The printed circuit board structure produced according to this method may comprise all features of the printed circuit board structure according to the invention. According to the inventive method, an initially plane printed circuit board may be produced, for example corresponding to the method of DE 101 08 168 C1, where on the inner side of a thin surface element of electrically conductive material, a conduction element is laid in a defined manner and contacted and fixed at the defined contact locations of the surface element. Subsequently, a stabilization surface element, for example in the form of a prepreg or a reinforcement layer cast into insulating resin, is connected with the contacted conduction element on the inner side of the surface element. Then, the thin surface element is structured, from its accessible outer side, for example by machining, laser evaporation or etching, such that the contact pads are separated from the rest of the surface element and are thus discretized and electrically insulated with respect to each other. Such a plane printed circuit board may then be provided, for example, with at least one predetermined bending edge, e. g. by removing printed circuit board material by means of laser beam machining or mechanical removal by milling. Subsequently, for example an assembly with electronic or electric components may be accomplished in an initially still flat state of the angle-adjustable printed circuit board structure. As an alternative, the electric or electronic components may be connected at least at some of the contact pads even after the angling of the printed circuit board sections.

The electronic circuit and all electrical connections of the spatial printed circuit board structure may be produced in one operation at one single, initially plane printed circuit board. Moreover, further operations, such as assembly operations with electronic components, alignment, circuit testing, troubleshooting and optional repairs, may also be conducted in a plane state of the printed circuit board. In particular, troubleshooting and repair are particularly easily possible in this plane state because no spatial structure has yet been formed which could hinder the accessibility to individual components of the circuit. The angled arrangement of the individual printed circuit board sections with respect to each other may be produced by simply bending the flexible conduction element which interconnects the printed circuit board sections. A further advantageous aspect of such an angled arrangement is the good thermal, electrical or electromagnetic separation or decoupling of different circuit areas. Moreover, such an angled area of a printed circuit board structure may advantageously serve for attaching display and/or input components and bushings, for example at the front side and possibly at different attachment levels.

It is furthermore possible to produce, by the method according to the invention, a closed printed circuit board housing by connecting a development of a cuboid consisting of six printed circuit board sections from an angle-adjustable plane printed circuit board structure, and thus produce a closed printed circuit board housing that may be assembled inside and outside.

In this manner, it is advantageously possible to accommodate components inside the housing, protected for example from condensing moisture, chemicals or other harmful influences or extreme thermal fluctuations. Here, it is also possible to protect the components of the circuit mounted inside the printed circuit board housing from changing environmental influences and possibly to also adjust their temperature and protect them from drafts to thus avoid impairments of their function and precision or premature aging. A further, very important aspect is the electrostatic and electromagnetic shielding, a so-called "ESD protection" of electrostatically sensitive components and high voltage protection of humans and electronic components.

Furthermore, in this manner, any undesired insight, access or repair attempt by unauthorized persons may be effectively prevented. The method according to the invention moreover permits to provide very compact, robust and mechanically tough printed circuit board structures which are characterized by a very high reliability of the conducting connections between the individual printed circuit board sections, a very low error rate in the production, and a minimum failure rate when they are being employed. In particular when the conduction element is embedded or guided within the printed circuit board structure and in protected regions of the bending edge, a subsequent damage of these conduction element connections after the production process is nearly excluded.

Further advantageous developments of the invention comprise, for example, the following features:

The conduction element may be welded to the contact pads. By this method, a particularly reliable, economical and efficient connection of connection areas is possible.

The one printed circuit board section may be positionally fixed with respect to another printed circuit board section, whereby a stable and mechanically robust spatial printed circuit board structure may be produced.

The conduction element may be contacted with the (not yet worked out) contact pads on a plane and thin surface element which is conductive at least in sections, preferably a conductive foil, where the surface element is subsequently cast or pressed with an insulation and stabilization agent, which preferably contains a reinforcement layer, on the side of the conduction element at least in sections to produce a printed circuit board. By this procedure step, a mechanically stable and resistant printed circuit board product may be produced from the surface element, such as for example a conductive copper foil, which may be machined and assembled in many ways.

The printed circuit board structure may be angled along the bending edge in a plastic state. This procedure step permits to reshape a uniformly designed printed circuit board carrier structure, for example without removing material, into a spatial structure and in the process to obtain a robust and mechanically stable product without any further stabilization measures after the solidification or curing of the printed circuit board material, e. g. by polymerization.

Furthermore, a groove along the bending edge may be formed in a plastic state of the printed circuit board structure, whereby in large-batch production, a particularly simple and inexpensive method for rendering the printed circuit board structure flexible, thus avoiding mechanical reprocessing, may be achieved.

Furthermore, the groove may be filled by embedding foreign matter along the bending edge before its solidification or curing, whereby, for example, a predetermined deformation line or parting line may be produced and mechanical processing of the printed circuit board structure may be omitted.

Moreover, the removal of the printed circuit board material along the bending edge may be effected by laser beam machining, whereby a very high processing speed may be achieved with avoiding depositions of removed material on the remaining printed circuit board structures.

As an alternative, the removal of the printed circuit board material along the bending edge may be accomplished by mechanical removal, preferably by means of milling or sawing. This represents a very efficient and productionally flexible way of producing a bending edge, in particular in small- and medium batch production.

After the removal of the printed circuit board material along the bending edge, the groove may be spaced apart from the conduction element, and preferably 5% to 30% of the original printed circuit board thickness may be maintained above the conduction element. By this embodiment, on the one hand a good stabilization of the deformation area may be achieved with avoiding mechanical damage of the conduction element by strains, shearing or upsetting deformation during bending, and on the other hand high security against unintentional damages of the conduction element extending in the angled region when the printed circuit board material is removed along the bending edge may be ensured in a simple and inexpensive way, even with relatively high work tolerances and without any additional measures. However, it is also possible to completely remove the printed circuit board material down to the level of the conduction element and not to let any printed circuit board material stand above the conduction element.

Furthermore, the conductive surface element may be removed before the removal of the printed circuit board material along the bending edge. In this manner, undesired metallic removal during the machining of the printed circuit board structure may be reliably avoided and a contacting of the conductive surface areas of the printed circuit board structure after it has been angled may be prevented.

The angling of the printed circuit board structure may be effected away from the side of the material removal or towards said side. In the first case, with a relatively narrow groove and a relatively low groove depth, and thus with relatively little material removal, a joint structure may be created which permits an angling of the printed circuit board sections with respect to each other without damaging the conduction element and which, upon completion of the angling process, is well accessible and may be filled with an insulation and stabilization agent from the outer side and be mechanically stabilized. Moreover, the removal of the printed circuit board material along the bending edge may be preferably accomplished in the form of a groove and angling may be effected in the direction of the groove. If an angling of the printed circuit board sections of the printed circuit board structure by 90° is intended, a groove may be milled into the printed circuit board material by means of a milling cutter, and thus a gap may be achieved between the individual printed circuit board sections that may be easily stabilized mechanically. It would moreover be possible to employ a milling cutter with a nose angle of more than 90° to maintain, in case of an angling of the printed circuit board sections of the printed circuit board structure by 90°, a separating gap between the individual angled printed circuit board sections which helps to achieve a better electrical and thermal separation of the printed circuit board sections.

Furthermore, the insulation and stabilization agent for producing a printed circuit board may comprise a reinforcing layer which is disposed adjacent to the conduction element and which is maintained at least partially when the printed circuit board sections are angled. This embodiment may be advantageous for the common printed circuit boards which are in most cases mechanically stabilized by lamination with a reinforcing layer, for example of glass cloth. Here, the harder glass cloth which provokes stronger tool wear does not have to be mechanically removed. At the same time, a very efficient stabilization element is maintained in the joint area between the individual printed circuit board sections of the printed circuit board structure which absorbs tension and thus effectively prevents a tearing of the joint area. This stabilization element on the one hand protects the conduction element from mechanical damage when the printed circuit board sections are angled, and on the other hand permits a far better mechanical stabilization of the angled area after the angle groove has been filled with an insulation and stabilization agent. Moreover, the reinforcing layer reliably holds down the laid conduction element and thus protects it from undesired damage during material removal along the angled edge. Moreover, the groove along the bending edge may be subsequently provided with an insulation and stabilization agent. By this, the printed circuit board sections of the printed circuit board structure may be, after having been angled, electrically insulated from each other and, being mechanically stabilized, connected into a functional spatial printed circuit board structure.

Moreover, from at least one printed circuit board section, at least two further printed circuit board sections may be produced. In this manner, it is e. g. possible to create a U-shaped spatial printed circuit board construct with two parallel assembly planes that can be assembled from two sides and which are electrically and thermally very well separated or decoupled.

Moreover, assuming the plane printed circuit board, at least six printed circuit board sections may be angled in such a way that they form the side faces of a closed housing. Such a structure is very compact and mechanically robust and provides a number of important advantages. In this manner, it is possible to accommodate components inside the housing, for example protected from condensing moisture, chemicals or other harmful influences or extreme thermal fluctuations. Here, the components of the circuit accommodated inside the printed circuit board housing may be protected from alternating environmental influences and possibly also be temperature-controlled and shielded from drafts, and thus impairments of function and precision or premature aging may be prevented. A further, very important aspect are the electrostatic and electromagnetic shielding, a so-called "ESD protection" of electrostatically sensitive components and a high voltage protection of humans and electronic components. Furthermore, any undesired insight, access or repair attempt by unauthorized persons may be effectively prevented in this manner. Moreover, very compact, robust and mechanically tough printed circuit board structures are formed in this manner which are characterized by a very high reliability of the conducting connections between the individual printed circuit board sections, a very low error rate in production, and a minimum failure rate when they are employed. Moreover, an exposed surface of the conduction element may be provided with at least one cover layer of insulating material. In this manner, an additional reasonable electric insulating layer may be applied.

The conduction element exposed by the individual printed circuit board sections in the area of the bending edge may then be fixed and protected at the printed circuit board sections by the conduction element being provided with at least one cover layer of insulating material before it is angled. Due to the production process, the printed circuit board sections will then contact each other along the bending edge or are at least directly opposed there, the conduction element extending via the bending edge and being embedded on either side between the respective printed circuit board section and the at least one cover layer of insulating material by a material bond.

Moreover, at least at some of the contact pads, electric or electronic components may be connected before or after angling. Thereby, a number of optimization possibilities for the production process results, where e. g. in a plane state, assembly operations with mechanical, electric and electronic components, alignment, circuit testing, troubleshooting and optional repairs may also be conducted much easier and without any obstructions due to spatial structures in a plane state of the printed circuit board. On the other hand, it may be suitable initially not to assemble particularly sensitive components or components that are attached to the outer side of the angled structure in order to protect them from damage during the mechanical processing of the printed circuit board structure.

The above mentioned embodiments of the invention only represent a selection of practical possibilities of designing the subject matter of the invention which are partly given in the individual subclaims and partly discussed in the description text. These special design options may be employed individually or, if technically possible and reasonable, also in combination with several ones of the above-mentioned design variants.

Below, the invention will be illustrated more in detail by way of example and with reference to the associated figures.

BRIEF DESCRIPTION OF THE FIGURES

In the drawing:

FIG. 1 shows a schematic perspective view of a printed circuit board structure according to the invention.

FIG. 2 shows a section II-II of FIG. 1 with a thickness of the printed circuit board structure that is disproportionately emphasized for illustration purposes.

FIG. 3 shows a partial section III-III of FIG. 2 through the bending edge.

FIG. 4 shows a view of a flat side of a shaped part in a non-deformed and disassembled state.

DETAILED DESCRIPTION

FIG. 1 shows a schematic perspective view of an angle-adjustable and angled printed circuit board structure 1 in accordance with the invention comprising two plane printed circuit board sections 2, 3 angularly arranged with respect to each other. A conduction element 4 embedded in the printed circuit board structure 1 extends between two contact pads 5 on different printed circuit board sections 2, 3 and is electrically conductively connected to said contact pads 5. As is represented in FIG. 1, the printed circuit board sections 2, 3 are angled relative to one another with maintenance of the connections of the contact pads 5 through the at least one conduction element 4 and with bending of said at least one conduction element 4 via a bending edge 6 between the printed circuit board sections 2, 3. According to the invention, it is provided that the conduction element 4 has, as viewed in cross-section, a larger extent along the bending edge 6 than perpendicularly thereto. In the present case, the bending edge 6 extends along a straight line from a border side of the printed circuit board structure 1 to an opposite border side of the printed circuit board structure 1 at the inner bending side BI of the printed circuit board structure 1 through the crest of the bend.

As conduction element 4, preferably a so-called flat wire or a plate-like shaped part 40 may be considered.

The flat wire is, for example, a conducting wire of copper and is made by extrusion. The shape and orientation of the conducting wire are selected such that the conducting wire has, as viewed in cross-section, a larger extent along the bending edge 6 than perpendicularly thereto. If the conducting wire has an essentially rectangular cross-section, the side of the cross-section with the larger extent extends along the bending edge 6 or in parallel thereto. Preferably, a conducting wire having a thickness D4 of 100 μm and a width B4 of about 1000 μm is used (cf. FIG. 3).

In an alternative embodiment, a plate-like shaped part 40 is employed as a conduction element 4 as is represented with view onto one of its flat sides 41 in a non-bent and disassembled state, for example in FIG. 4. The shaped part 40 consists, for example, of copper and may be separated from a plate-like workpiece, in particular by punching. The shaped part 40 may be embedded into the printed circuit board structure 1 at least in sections, so that at least one flat side 41 of the shaped part 40 passes over in a flush manner into an adjacent surface of the printed circuit board structure 1, and the flat sides 41 of the shaped part 40 are oriented to be parallel to the flat sides of the printed circuit board structure 1. The shaped part 40 preferably has a thickness of (more than) 100 μm, the width of the shaped part 40 being preferably clearly larger than that of a conducting wire. Thereby, even larger currents and quantities of heat may be transmitted between the printed circuit board sections. The shaped part 40 shown in FIG. 4 comprises a rectangular cross-section which is preferably constant along the bending edge 6. The shaped part 40 is typicality installed into the printed circuit board structure 1 such that the bending edge 6 is oriented perpendicularly to the long border sides 42a of the shaped part 40 and in parallel to the short border sides 42b of the shaped part 40. A recess 43 is worked into the shaped part 40 starting from a long border side 42a of the shaped part 40. Moreover, the shaped part comprises a breakthrough 44 which extends through the shaped part 40 perpendicularly to the flat side 41, the breakthrough 44 having an essentially slot-like design and extending continuously along a straight line in parallel to a long border side 42a of the shaped part 40. In the assembled state, the breakthrough 44 is preferably filled with insulation and stabilization agent 9 and penetrated by it. Furthermore, the shaped part 40 comprises an opening 45 that extends from the flat side 41 in sections into the shaped part 40 and has an essentially groove-like design, and continuously extends along a straight line parallel to the long border side 42a of the shaped part 40 and parallel to the direction of extension of the breakthrough 44. The opening 45 is also preferably filled with insulation and stabilization agent 9 in an assembled state.

In a ready-for-use state of the printed circuit board structure 1, the contact pads 5 are each disposed at one surface of the printed circuit board sections 2, 3 and contact the conduction element 4 from above and, as intended, one electric component each from the bottom, so that the conduction element 4 and the electronic component are disposed at different flat sides of the contact pad 5. Contacting between the contact pad 5 and the conduction element 4 and/or between the contact pad 5 and the electric component is accomplished at least at one contact location by welding, bonding, soldering or conductive adhesion. Each contact pad 5 is preferably worked out of a thin and conductive surface element 8 disposed at the surface of the printed circuit board structure 1, such as a copper foil having a thickness of, for example, 35 µm, by etching. By removing part of the surface element 8 in areas by etching, for example, a whole conductive pattern having several strip conductors 80 and contact pads 5 is created. As is shown in FIG. 1, several contact pads 5 and/or several conduction elements 4 may communicate via at least one etched strip conductor 80. In the present example, an etched strip conductor 80 extends from an etched contact pad 5 in a first printed circuit board section 2 via the bending edge 6 to another etched contact pad 5 in another, second printed circuit board section 3 and extends at the outer bending side BA, so that the strip conductor 80 is disposed radially outside the conduction element 4, based on the bend radius BR of the printed circuit board structure 1. As an alternative or in addition, at least one strip conductor 80 may extend at the inner bending side BI. Since the bend radius is larger at the outer bending side BA than at the inner bending side BI, the bend or the mechanical load of the strip conductor 80 is, however, smaller at the outer bending side BA than at the inner bending side BI.

Between the printed circuit board sections 2, 3, there is a deformation section 7 which is designed to facilitate an angling of the printed circuit board structure 1 with bending of the conduction element 4 over the bending edge 6. For this, the stiffness and strength of the printed circuit board structure 1 are reduced in the deformation section along the bending edge 6 by material removal at the inner bending side BI with respect to the adjoining printed circuit board sections 2, 3, so that along the bending edge 6 at the inner bending site BI, a groove 11 with a constant width is formed which tapers from the groove bottom to the groove opening when the printed circuit board structure 1 is angled with bending of the conduction element 4 over the bending edge 6. To fix an angled state of the printed circuit board structure 1, foreign matter may be incorporated in the groove 11. As an alternative or in addition, the stiffness and strength of the printed circuit board structure 1 may be reduced in the deformation section along the bending edge 6 by material removal, but also at the outer bending side BA with respect to the adjoining printed circuit board sections 2, 3, so that along the bending edge 6 at the outer bending site BA, a groove 11 with a constant width is formed which correspondingly widens from the groove bottom to the groove opening when the printed circuit board structure 1 is angled with bending of the conduction element 4 over the bending edge 6. In this groove 11, too, foreign matter may be incorporated to fix an angled state of the printed circuit board structure 1. In the present example, a bend radius BR of the printed circuit board structure 1 at the inner bending side BI is about 6 mm, the thickness D1 of the printed circuit board structure 1 in the radial direction being within a range of about 200 to 300 µm.

An insulation and stabilization agent 9 separates several conductive layers from conductive surface elements 8 and surrounds the one conduction element 4, as viewed in cross-section, over a majority of its circumference, wherein the insulation and stabilization agent 9 may also be disposed between a contact pad 5 and the conduction element 4 except for the contact locations. The insulation and stabilization agent 9 may furthermore comprise a reinforcement and cover the conductive element 4, as viewed in cross-section, at the border sides and/or both flat sides, preferably also in the deformation section 7 at the outer bending side BA and at the inner bending side BI.

In the electrically insulating printed circuit board structure 1 represented in FIG. 1, accordingly an electric or electronic circuit is realized which includes, apart from at least one electric strip conductor 80 extending at the printed circuit board surface, also at least one electrically conductive conduction element 4 which is disposed inside the printed circuit board structure 1.

The production of the printed circuit board structure 1 according to the invention will be described below:

First, the conduction element 4 is contacted at predetermined areas at later contact pads 5 with a copper foil 8, contacting being accomplished, for example, by welding, bonding, soldering, soldering adhesion or the like. The conduction element 4 is, for example, provided with an insulation to be able to arrange conduction elements 4 in several planes one upon the other. After the copper foil 8 has been contacted with the conduction element 4, the copper foil 8 may form a plane printed circuit board, for example by pressing with a stabilizing surface element. The construction and production of such a printed circuit board 1 including wire-writing is known, for example, from DE 101 08 168 C1. For example, a multiwire printed circuit board may possibly be produced analogously using a wire-writing method, where on the inner side of the thin and conductive surface element 8, such as the copper foil 8, a corresponding conduction element 4 is laid in a defined manner and fixed at defined contact locations of the surface element 8. Subsequently, on the inner side of the thin conductive surface element 8 with the contacted conduction element 4, a stabilization surface element of an insulation and stabilization agent 9 is fixed. This may be accomplished, for example, by pressing by means of a prepreg or by casting a reinforcement layer, for example by means of synthetic resin, and subsequent curing of the compound. Then, the thin surface element 8 is structured, for example, by partially etching from its outer side, such that the contact pads 5 and/or the at least one strip conductor 80 are separated from the rest of the surface element 8 and thus electrically insulated from each other. The wire-written printed circuit board 1 accordingly comprises, for example, additionally etched strip conductors 80 which are electrically connected with the contact pads 5. Separated each by the insulation and stabilization agent 9, the printed circuit board 1 may comprise several layers of the thin and conductive surface element 8, as is shown in FIG. 2.

In an alternative production process, the conduction element 4 is applied onto a plate-like substrate of an insulation and stabilization agent 9 which comprises one thin conductive surface element 8 on each of its two outer sides each. Subsequently, the contact pads 5 and strip conductors 80 are worked out of the thin conductive solid area 8 by partial material removal. Electric components may be connected, for example, in the course of throughplating with the shaped part on the other side of the plate-like substrate.

The conduction element 4 and the strip conductor 80 are, in the present example, cast into a wiring plane or disposed on the upper side of the printed circuit boards 1. In the present case, consequently a combination of etched strip conductors 80 and connections with a flat conduction element 4 is realized on the individual printed circuit board structure 1. Here, etched strip conductors 80 may be arranged on printed circuit board sections 2, 3 of the printed circuit board structure 1 and distributed in such a manner that the conduction element 4 and no, or at least one etched strip conductor 80, extends between the individual printed circuit board sections 2, 3. Equally, however, an electrical interconnection may be realized within a printed circuit board section 2, 3 which contains at least one conduction element 4 which is only associated with this printed circuit board section 2, 3. Moreover, at least at some of the contact pads 5, electric or electronic components may be connected before or after angling.

For producing a spatial printed circuit board structure 1, a groove 11 is e. g. milled or sawed into the printed circuit board material or into the insulation material of the printed circuit board, starting from a flat side of the printed circuit board structure 1, in a deformation section 7 between two printed circuit board sections 2, 3 according to a further production step, preferably transversely to the direction of extension of the conduction element 4 extending between the printed circuit board sections 2, 3. In the process, it is taken care that the conduction element 4 connecting the printed circuit board sections 2, 3 is not damaged. Here, it is possible to leave some hundred µm of the printed circuit board material above the conduction element 4 on the later inner bending side BI and/or on the later outer bending side BA to exclude the risk of damaging the conduction element 4 and to ensure a better mechanical stabilization of the hinge area. However, it is also possible to completely remove the printed circuit board material down to the level of the conduction element 4 and not to let any printed circuit board carrier material stand above the conduction element 4. The at least one etched strip conductor 80 is preferably disposed such that it is not interrupted by the material removal along the bending edge 6, i. e. in particular on the respective other side of the material removal or at the outer bending side BA when material removal is effected at the inner bending side BI, or vice-versa. However, a separate strip conductor structure and/or conduction element structure may be associated with each printed circuit board section 2, 3, which structure is only in electrically conductive connection with the printed circuit board structures and/or the conduction element structures of another printed circuit board section 2, 3 through the conduction element.

Then, the printed circuit board sections 2, 3 are folded along the bending edge 6, as can be seen in FIG. 2. The conduction element 4 then acts as a solid-state joint since it establishes, apart from the electrical connection, also a mechanical connection between the printed circuit board sections 2, 3 and is flexible on the other hand. It is also possible to mechanically reinforce the joint area between the printed circuit board sections 2, 3 by non-removed printed circuit board material and possibly also non-removed parts of a reinforcement layer embedded in the printed circuit board structure 1, and to protect the conduction element 4 from damage when the groove is introduced along the bending edge 6 and to avoid excessive stretching, shearing or upsetting in the folding process. The printed circuit board sections 2, 3 may contact each other, for example, along the bending edge 6, and the conduction element 4 extending between them will then be embedded by a material bond on either side in the insulation and stabilization agent 9 and extend via the bending edge 6.

Finally, the printed circuit board sections 2, 3 may be positionally fixed with respect to each other, for example by gluing or filling the groove 11 or by attaching angles to maintain a three-dimensional shape.

For producing an inventive printed circuit board structure 1, it is possible to interconnect discrete contact pads 5 and conduction structures e. g. disposed on a support layer by means of the flat conduction element 4 and to produce from it a corresponding printed circuit board, for example by adhesion or pressing with a stabilization surface element. As an alternative, it is possible, after the laying of the conduction element 4 but still before the angling of the finished printed circuit board structure 1, to etch the copper foil 8 disposed at the surface to work the contact pads 5 out of the copper foil 8 and separate them from other areas of the copper foil 8 and electrically insulate them from each other. Since, however, the contact pads 5 are already known before from the existing circuit layout, the connections of the conduction element 4 with the actually not yet existing contact pads 5 may be finished in advance. Subsequently, the surface of the copper foil 8 provided with the conduction element 4 may then be covered with a mechanically stabilizing and electrically insulating layer of insulation and stabilization agent 9, for example by pressing a prepreg with a reinforcing cloth embedded therein with the copper foil 8 on the side of the slightly contacted conduction element 4.

The invention claimed is:

1. An angle-adjustable and/or angled printed circuit board structure comprising:
   at least two printed circuit board sections arrangeable or arranged angularly with respect to each other,
   wherein the printed circuit board structure comprises at least one conduction element extending between two contact pads and being electrically conductively connected to said contact pads,
   wherein the two contact pads are situated on different printed circuit board sections,
   wherein the printed circuit board sections are angle-adjustable and/or angled relative to one another with maintenance of the connections between the contact pads and the at least one conduction element and with bending of the at least one conduction element via a bending edge between the printed circuit board sections,
   wherein the conduction element has, as viewed in cross-section, a larger extent along the bending edge than perpendicularly thereto.

2. The angle-adjustable and/or angled printed circuit board structure according to claim 1, wherein the conduction element is a conducting wire which meets at least one of the following requirements:
   The conducting wire consists of a conductive material, preferably of metal, preferably of copper;
   The conducting wire is made by extrusion;

The conducting wire has a polygonal, preferably rectangular or essentially rectangular cross-section, wherein the side of the cross-section having the larger extent extends along the bending edge or in parallel thereto;

The conducting wire has, preferably in a cross-section along the bending edge, a thickness within a range of 10 to 500 μm, preferably within a range of 50 to 400 μm, preferably within a range of 100 to 200 μm;

A width of the conducting wire is, preferably in a cross-section along the bending edge, at least 1.5 to 100 times, preferably 2 to 10 times larger than the thickness of the conducting wire;

At least the majority of the conducting wire is embedded in the printed circuit board structure The conducting wire is roughened;

The conducting wire is chemically roughened, preferably by chemical etching, chemical etching being preferably accomplished by immersing the conducting wire into a liquid that etches the material of the conducting wire or by spraying the conducting wire with such a liquid; and The conducting wire is mechanically roughened, preferably by machining, preferably by knurling, by sandblasting or by spraying on pumice or quartz powder under high pressure.

3. The angle-adjustable and/or angled printed circuit board structure according to claim 1, wherein the conduction element is a plate-like shaped part which meets at least one of the following requirements:

The shaped part consists of an electrically conductive material, preferably of metal, preferably of copper;

At least some sections, preferably all of the shaped part, are embedded in the printed circuit board structure;

The flat sides of the shaped part are oriented essentially in parallel to at least one surface of the printed circuit board structure;

At least one flat side of the shaped part flushly passes over into an adjoining surface of the printed circuit board structure;

The shaped part is separated from a plate-like workpiece, preferably by water jet cutting, eroding or separating, preferably by punching;

The shaped part has, preferably in a cross-section along the bending edge, a thickness within a range of 50 to 500 μm, preferably within a range of 75 to 400 μm, preferably within a range of 100 to 300 μm;

A width of the shaped part is, preferably in the cross-section along the bending edge, at least five times, preferably at least ten times, preferably at least twenty times, preferably at least fifty times or preferably at least one hundred times as large as the thickness of the shaped part;

The shaped part comprises, preferably in a cross-section along the bending edge, a rectangular or essentially rectangular cross-section;

The thickness of the shaped part is constant, preferably in a cross-section along the bending edge;

The shaped part projects at least in sections from the printed circuit board structure preferably in the area of at least one circuit board section;

The shaped part comprises at least one recess which is worked into the shaped part starting from a border side of the shaped part;

shaped part comprises at least one breakthrough which extends transversely, preferably perpendicularly, to a flat side or a border side of the shaped part through the shaped part, the breakthrough preferably comprising a circular, oval, polygonal, preferably triangular, quadrangular, pentangular, rectangular or square contour, wherein the breakthrough preferably has an essentially slot-like design and continuously or discontinuously extends along a straight or bent line, this line extending particularly preferred at least in sections in parallel to a border side of the shaped part, wherein the breakthrough is particularly preferred filled with insulation and stabilization agent at least in sections;

The shaped part comprises at least one opening which extends from a flat side or a border side of the shaped part in sections into the shaped part, the opening preferably comprising, at least in the area of its orifice, a circular, oval, polygonal, preferably triangular, quadrangular, pentangular, preferably rectangular or square contour, wherein the opening preferably has an essentially groove-like design and continuously or discontinuously extends along a straight or bent line, said line extending particularly preferred at least in sections in parallel to a border side of the shaped part, wherein the opening is particularly preferred filled with insulation and stabilization agent at least in sections;

The shaped part and/or a section of the shaped part is, when viewed onto a flat side of the shaped part, essentially I-shaped, L-shaped, T-shaped, H-shaped, S-shaped, O-shaped, E-shaped, F-shaped, X-shaped, Y-shaped, Z-shaped, C-shaped, U-shaped or Ω-shaped Several shaped parts are arranged in the same plane or in different planes, preferably in planes parallel with respect to each other within the printed circuit board structure;

At least the majority of the shaped part is embedded in the printed circuit board structure;

The shaped part is roughened;

The shaped part is chemically roughened, preferably by chemical etching, chemical etching being preferably accomplished by immersing the shaped part into a liquid that etches the material of the shaped part or by spraying the shaped part with such a liquid; and The shaped part is mechanically roughened, preferably by machining, preferably by knurling, by sandblasting or by spraying on pumice or quartz powder under high pressure.

4. The angle-adjustable and/or angled printed circuit board structure according to claim 1, wherein at least one contact pad meets at least one of the following requirements:

The contact pad is arranged at a surface of the printed circuit board structure;

The contact pad contacts the conduction element and/or at least one electric component at least at one contact location each, wherein the conduction element and/or the electronic component are preferably arranged at different flat sides of the contact pad, wherein preferably several contact locations are spaced apart preferably at regular distances;

Contacting between the contact pad and the conduction element and/or between the contact pad and the at least one electric component at the at least one contact location is accomplished by welding, bonding, soldering or conductive adhesion;

The contact pad consists of metal, preferably of copper;

The contact pad is, preferably by etching, worked out of a conductive surface element, in particular of a copper foil;

The contact pad has a thickness within a range of 1 to 200 μm, preferably within a range of 10 to 100 μm, preferably within a range of 15 to 50 μm;

In at least one region between the contact pad and the conduction element, preferably between two contact locations and/or around at least one contact location, an insulation and stabilization agent is arranged;

Several contact pads and/or several conduction elements are connected via at least one strip conductor, the strip conductor preferably being printed or etched; and The contact pad is designed for electrical connections and/or for electric components.

5. The angle-adjustable and/or angled printed circuit board structure according to claim 1, wherein the bending edge meets at least one of the following requirements:

The bending edge has an essentially linear design;

The bending edge extends at least in sections along a straight and/or bent lineal;

The bending edge extends from a border side of the printed circuit board structure to an opposite border side of the printed circuit board structure;

The bending edge extends at the inner bending side of the printed circuit board structure through the crest of the bend; and The bending edge extends at a surface of the printed circuit board structure or in parallel to the same.

6. The angle-adjustable and/or angled printed circuit board structure according to claim 1, wherein the printed circuit board structure comprises a deformation section comprising the bending edge between the printed circuit board sections, wherein the deformation section meets at least one of the following requirements:

In the deformation section, the stiffness and/or the stability and/or the strength of the printed circuit board structure is reduced with respect to the adjoining printed circuit board sections, preferably along the bending edge, preferably at the inner bending side and/or at the outer bending side;

In the deformation section, the circuit board material is at least partially removed, preferably at the inner bending side and/or at the outer bending side, preferably by milling, sawing or laser beam machining;

In the deformation section, the printed circuit board structure comprises at least one groove which preferably extends at least in sections along the bending edge at the inner bending side and/or the outer bending side, wherein the groove preferably has a constant width or tapers from the groove opening to the groove bottom, or vice-versa, wherein particularly preferred foreign matter is incorporated in the groove in order to fix an angled state of the printed circuit board structure;

In the deformation section, a bend radius of the printed circuit board structure and/or the conduction element at the inner bending side is within a range of 0.05 to 10 mm, preferably within a range of 1 to 8 mm, preferably within a range of 3 to 7 mm;

In the deformation section, the thickness of the printed circuit board structure is within a range of 100 to 1000 µm, preferably within a range of 150 to 500 µm, preferably within a range of 200 to 300 µm; and The deformation section forms a solid-state joint to be able to flexibly move the printed circuit board sections with respect to each other.

7. The angle-adjustable and/or angled printed circuit board structure according to claim 1, wherein the printed circuit board structure comprises at least one thin surface element which is conductive at least in sections, which meets at least one of the following requirements:

The surface element is a conductive foil, preferably a copper foil;

The surface element is produced by rolling;

The surface element has a thickness within a range of 10 to 100 µm, preferably within a range of 20 to 50 µm, preferably within a range of 30 to 40 µm;

At least one surface element is arranged at least in sections at a surface of the printed circuit board structure;

At least one surface element is arranged at least in sections parallel to a surface of the printed circuit board structure underneath said surface of the printed circuit board structure;

The surface element is removed in sections to form at least one strip conductor and/or at least one contact pad;

At least one strip conductor and/or at least one contact pad is worked out of the surface element, preferably by etching;

At least one surface element or at least one strip conductor and/or contact pad worked out of the surface element extends from a printed circuit board section via the bending edge into another printed circuit board section;

At least one surface element is arranged at the outer bending side or at the inner bending side of the printed circuit board structure; and At least one surface element is, based on the bend radius of the printed circuit board structure, arranged radially outside the at least one conduction element.

8. The angle-adjustable and/or angled printed circuit board structure according to claim 1, wherein the printed circuit board structure comprises an insulation and stabilization agent which meets at least one of the following requirements:

The insulation and stabilization agent separates at least two conductive layers, preferably at least two conductive surface elements;

The insulation and stabilization agent surrounds the at least one conduction element, as viewed in cross-section, over at least a part of its circumference;

The insulation and stabilization agent covers the at least one conduction element, as viewed in cross-section, at least at one border side and/or at least at one flat side, preferably at the outer bending side and/or at the inner bending side;

The insulation and stabilization agent surrounds the at least one conduction element, as viewed in cross-section, over its entire circumference, except for one or several contact locations to at least one electrically conductive contact pad; and The insulation and stabilization agent comprises a reinforcement, preferably a glass-fiber reinforcement.

9. A method for producing an angle-adjustable and/or angled printed circuit board structure having at least two printed circuit board sections according to at least one of the preceding claims, comprising the following steps:

producing a plane printed circuit board having at least one conduction element which has, as viewed in cross-section or in parallel to the printed circuit board plane, a larger extent than perpendicularly thereto, wherein the conduction element extends between two contact pads and is electrically conductively connected with said contact pads, wherein the two contact pads are located on different printed circuit board sections; and providing at least one bending edge between the printed circuit board sections, wherein said printed circuit board sections are angle-adjustable relative to one another with maintenance of the connections between the contact pads and the at least one conduction element and with bending of the at least one conduction element via the bending edge.

* * * * *